(12) United States Patent
Shafer et al.

(10) Patent No.: US 7,218,445 B2
(45) Date of Patent: May 15, 2007

(54) MICROLITHOGRAPHIC REDUCTION PROJECTION CATADIOPTRIC OBJECTIVE

(75) Inventors: David R. Shafer, Fairfield, CT (US); Russell Hudyma, San Ramon, CA (US); Wilhelm Ulrich, Aalen (DE)

(73) Assignee: Carl-Zeiss Stiftung, Oberkochen (DE)

( * ) Notice: Subject to any disclaimer, the term of this patent is extended or adjusted under 35 U.S.C. 154(b) by 0 days.

(21) Appl. No.: 10/438,153

(22) Filed: May 13, 2003

(65) Prior Publication Data

US 2004/0027653 A1 Feb. 12, 2004

Related U.S. Application Data

(62) Division of application No. 09/761,562, filed on Jan. 16, 2001, now Pat. No. 6,636,350.

(60) Provisional application No. 60/176,190, filed on Jan. 14, 2000.

(51) Int. Cl.
*G02B 17/08* (2006.01)

(52) U.S. Cl. ...................... 359/366; 359/731

(58) Field of Classification Search ........ 359/364–366, 359/726–734, 857–859
See application file for complete search history.

(56) References Cited

U.S. PATENT DOCUMENTS

| | | | | |
|---|---|---|---|---|
| 3,762,801 A * | 10/1973 | Baker | ................... | 359/716 |
| 4,171,871 A | 10/1979 | Dill et al. | | |
| 4,232,969 A | 11/1980 | Wilczynski | | |
| 4,595,295 A | 6/1986 | Wilczynski | | |
| 4,685,777 A | 8/1987 | Hirose | | |
| 4,701,035 A | 10/1987 | Hirose | | |
| 4,757,354 A | 7/1988 | Sato et al. | | |
| 4,812,028 A * | 3/1989 | Matsumoto | ................... | 359/366 |
| 5,052,763 A | 10/1991 | Singh et al. | | |
| 5,063,586 A | 11/1991 | Jewell et al. | | |
| 5,071,240 A | 12/1991 | Ichihara et al. | | |
| 5,078,502 A | 1/1992 | Cook | | |
| 5,089,913 A | 2/1992 | Singh et al. | | |
| 5,153,898 A | 10/1992 | Suzuki et al. | | |

(Continued)

FOREIGN PATENT DOCUMENTS

| | | |
|---|---|---|
| DE | 197 26 058 A1 | 1/1998 |
| DE | 196 39 586 | 4/1998 |
| EP | 0 779 528 | 6/1997 |
| EP | 0 604 093 | 11/1997 |
| EP | 0 869 383 | 10/1998 |
| EP | 0 816892 | 6/1999 |
| EP | 1 069 448 | 7/2000 |
| EP | 1 067 448 | 1/2001 |
| EP | 1 336 887 | 8/2003 |
| WO | WO-94/06047 | 3/1994 |

OTHER PUBLICATIONS

Morgan, Joseph, Introduction to Geometrical and Physical Optics, McGraw-Hill, 1953, p. 2.

(Continued)

*Primary Examiner*—Mark A. Robinson
(74) *Attorney, Agent, or Firm*—Darby & Darby (57) ABSTRACT

A photolithographic reduction projection catadioptric objective includes a first optical group having an even number of at least four mirrors and having a positive overall magnifying power, and a second substantially refractive optical group more image forward than the first optical group having a number of lenses. The second optical group has a negative overall magnifying power for providing image reduction. The first optical group provides compensative aberrative correction for the second optical group. The objective forms an image with a numerical aperture of at least substantially 0.65, and preferably greater than 0.70 or still more preferably greater than 0.75.

9 Claims, 4 Drawing Sheets

U.S. PATENT DOCUMENTS

| | | |
|---|---|---|
| 5,159,172 A | 10/1992 | Goodman et al. |
| 5,212,588 A | 5/1993 | Viswanathan et al. |
| 5,220,590 A | 6/1993 | Bruning et al. |
| 5,241,423 A | 8/1993 | Chiu et al. |
| 5,315,629 A | 5/1994 | Jewell et al. |
| 5,323,263 A | 6/1994 | Schoenmakers |
| 5,353,322 A | 10/1994 | Bruning et al. |
| 5,401,934 A | 3/1995 | Ainsworth, Jr. et al. |
| 5,410,434 A | 4/1995 | Shafer |
| 5,515,207 A | 5/1996 | Foo |
| 5,537,260 A | 7/1996 | Williamson |
| 5,575,207 A | 11/1996 | Shimizu |
| 5,592,329 A | 1/1997 | Ishiyama et al. |
| 5,608,526 A | 3/1997 | Piwonka-Corle et al. |
| 5,650,877 A | 7/1997 | Phillips et al. |
| 5,652,679 A | 7/1997 | Freeman |
| 5,684,636 A * | 11/1997 | Chow et al. ............ 359/665 |
| 5,686,728 A | 11/1997 | Shafer |
| 5,694,241 A | 12/1997 | Ishiyama et al. |
| 5,742,436 A | 4/1998 | Furter |
| 5,805,357 A | 9/1998 | Omura |
| 5,805,365 A | 9/1998 | Sweatt |
| 5,815,310 A | 9/1998 | Williamson |
| 5,835,275 A | 11/1998 | Takahashi et al. |
| 5,940,222 A | 8/1999 | Sinclair et al. |
| 5,956,192 A | 9/1999 | Williamson |
| 6,008,885 A | 12/1999 | Takahashi et al. |
| 6,014,252 A | 1/2000 | Shafer |
| 6,033,079 A | 3/2000 | Hudyma |
| 6,084,724 A * | 7/2000 | Wiegand et al. ............ 359/796 |
| 6,142,641 A | 11/2000 | Cohen et al. |
| 6,169,627 B1 | 1/2001 | Schuster |
| 6,172,825 B1 | 1/2001 | Takahashi et al. |
| 6,185,049 B1 * | 2/2001 | Terada et al. ............ 359/689 |
| 6,255,661 B1 | 7/2001 | Braat et al. |
| 6,636,350 B2 * | 10/2003 | Shafer et al. ............ 359/366 |

OTHER PUBLICATIONS

Smith, Warren J. Modern Optical Engineering: the Design of Optical Systems, 3rd Ed, McGraw-Hill, 2000, p. 98.

* cited by examiner

MICROLITHOGRAPHIC REDUCTION PROJECTION CATADIOPTRIC OBJECTIVE

CROSS-REFERENCE TO RELATED APPLICATION

This application is a divisional of U.S. patent application Ser. No. 09/761,562, filed Jan. 16, 2001 now U.S. Pat. No. 6,636,350, which claims the benefit of U.S. patent application Ser. No. 60/176,190, filed Jan. 14, 2000, both of which are hereby incorporated by reference in their entirety.

BACKGROUND

1. Field of the Invention

The invention relates to a microlithographic reduction projection catadioptric objective, and particularly including an even number of four or more mirrors and an unobscured aperture, and excluding any planar folding mirrors.

2. Description of the Related Art

Microlithogrphic reduction projection catadioptric objectives, such that shown and described with respect to FIG. 3 of European patent no. EP 0 779 528 A2, are known as variants of pure catoptric objectives. FIG. 3 of the '528 application shows a system having six mirrors and three lenses. The optical surfaces are generally symmetric to a common axis upstream and downstream of the objective, respectively. As described in the '528 application, the system of FIG. 2 has a numerical aperture of only 0.55 and that of FIG. 3 only 0.6. In addition, all but one of the six mirrors shown at FIG. 3 are cut off sections of bodies of revolution, yielding mounting and adjustment face difficulties. Also, the lenses shown in FIG. 3 serve only as correcting elements having minor effect. The most image forward (or optically closest to the image plane) mirror is concave. It is desired to have an objective with a higher numerical aperture, and which is constructed for easier mounting and adjustment.

A similar objective to that described in the '528 application (above) is disclosed at U.S. Pat. No. 4,701,035. The objective shown at FIG. 12, for example, has nine mirrors, two lenses and two intermediate images. The object plane and image plane are situated within the envelope of the objective. The objective described in the '035 application also exhibits a low numerical aperture and offers similar mounting and adjustment difficulties as described above with respect to the '528 application. In both the '528 and '035 applications, the image field is an off-axis ring sector.

An axially symmetric type of catadioptric objective is disclosed in German patent document DE 196 39 586 A (U.S. patent application Ser. No. 09/263,788). The '788 application discloses an objective having two opposing concave mirrors, an image field centered at the common axis and a central obscuration of the aperture. It is desired to have an axially objective having an unobscured aperture.

Another type of catadioptric objective for microlithographic reduction projection has only one concave mirror and a folding mirror, as is described at U.S. Pat. No. 5,052,763 and European patent application no. EP 0 869 383 A.

In extending DUV lithography to sub 100-nm feature sizes or linewidths, it is desired to have a projection system with a numerical aperture of 0.65 or larger and more preferably of 0.75 or larger at a wavelength of 157 nm. As optical lithography is extended into the vacuum ultraviolet (VUV), issues surrounding the laser linewidth and material availability could cause substantive delays to the development of lithography tools for the most extreme VUV wavelengths. Therefore, it is desired to investigate optical configurations that minimize the use of available VUV optical materials.

It has long been realized that catadioptric optical systems have several advantages, especially in a step and scan configuration and various organizations have developed, or proposed development, of such systems for wavelengths below 365 nm. One catadioptric system concept relates to a Dyson-type arrangement used in conjunction with a beam splitter to provide ray clearance and unfold the system to provide for parallel scanning (e.g., U.S. Pat. Nos. 5,537,260, 5,742,436 and 5,805,357). However,these systems have a serious drawback since the size of this beam splitting element becomes quite large as the numerical aperture is increased up to and beyond 0.65 to 0.70, making the procurement of bulk optical material with sufficient quality (in three-dimensions) a high risk endeavor. This problem is exacerbated as wavelengths are driven below 193 rm because the selection of material that can be manufactured to lithographic quality is severely limited.

To circumvent this problem, attempts have focused on the development of systems without beamsplitters. However, this prior art has either failed to achieve an adequately high numerical aperture (e.g., U.S. Pat. Nos. 4,685,777, 5,323, 263, 5,515,207 and 5,815,310), or failed to achieve a fully coaxial configuration, instead relying on the use of folding mirrors to achieve parallel scanning (e.g., U.S. Pat. No. 5,835,275 and EP 0 816 892) and thereby complicating the alignment and structural dynamics of the system. In addition, these designs generally utilize mtoo any lens elements, greatly increasing the mass of the optical system.

It is desired to develop a compact, coaxial, catadioptric projection system for deep ultraviolet and/or vacuum ultraviolet lithography that uses no beamsplitters or fold mirrors in its optical path.

It is an object of the invention to provide an objective for microlithographic projection reduction having high chromatic correction for typical bandwidths of excimer laser light sources, which permits a high image-side numerical aperture, and which reduces complexity with respect to mounting and adjusting.

SUMMARY OF THE INVENTION

In accordance with the above object, a photolithographic reduction projection catadioptric objective is provided including a first optical group having an even number of at least four mirrors, and a second substantially refractive optical group more image forward than the first optical group having a number of lenses. The second optical group provides image reduction. The first optical group provides compensative aberrative correction for the second optical group. The objective forms an image with a numerical aperture of at least substantially 0.65, and preferably greater than 0.70 or still more preferably greater than 0.75.

The first optical group preferably produces a virtual intermediate image. The more image forward mirror is preferably convex, although a concave final mirror may produce the virtual image. In addition, optical surfaces of each mirror of the objective are preferably at least sections of revolution each having a common optical axis, and more preferably optical surfaces of each mirror and each lens of the objective are at least sections of revolution each having this common axis.

The objective preferably has an unobscured system aperture located within the second optical group, and there are preferably no folding mirrors in the objective. The second group preferably more lenses that the number of mirrors in the first group, and more preferably includes at least eight lenses.

The objective also preferably has parallel axes of symmetry of curvatures of each optical element of the first and second optical groups. In addition, preferably no more than two and more preferably no more than one of the optical elements are cut to deviate in a substantially non-rotationally symmetric form.

Also preferably, the objective includes in sequence, in an optical direction from an object side to an image side of the objective, a first catadioptric sub group for producing a real intermediate image, a second sub group including catoptric components for producing a virtual image, and a third dioptric group for producing a real image. The objective may include in sequence, in an optical direction from the object side to the image side of the objective, a first field lens sub group, a second catadioptric sub group comprising one or more negative lenses and a concave mirror for generating axial chromatic aberration, and a third sub group including an odd number of catoptric components, and a fourth positive lens sub group.

The objective may also include in sequence, in an optical direction from the object side to the image side, a first catadioptric sub group comprising a single mirror and having a negative reduction ratio, a second sub group comprising an odd number of mirrors and having a positive reduction ratio, and a third dioptric lens sub group having a negative reduction ratio. In the latter case, the first catadioptric sub group may include a positive field lens group and a negative lens group next to the single mirror, and the third dioptric lens sub group may include a larger number of positive than negative lenses.

The most image forward mirror of said first optical group is convex. An intermediate image is preferably formed before the two most image forward mirrors of the first optical group.

An image field may be between substantially 5 mm×20 mm to 8 mm×30 mm. Each lens of the objective is preferably unobstructive of a beam path of a bean incident at the objective. The objective also preferably includes at least one spherical mirror.

The optical surfaces of each mirror of the objective are preferably at least sections of revolution each having a common optical axis. The first optical group preferably includes four mirrors, and wherein in sequence, from an object side to an image side of the objective, the first and third mirrors are concave and the fourth mirror is convex.

An aperture plane is preferably located within a sub group of the first optical group for generating catadioptric chromatic aberration and has at least one negative lens and a concave mirror. The first optical group preferably includes a field lens group proximate to and after an object plane which produces object side telecentricity. The objective is preferably doubly telecentric.

All lenses of the objective are preferably located within a cylindrical envelope of a radius of a largest of the lenses of the objective, and all but one mirror of the objective is located within the same envelope.

A virtual image is preferably formed within the first optical group, and more preferably between the second and the third mirror of the first optical group. Each optical element of the first optical group is preferably substantially spherical.

The optical elements of the objective are preferably aligned along a common optical axis of symmetry of curvatures of each optical element of the first and second optical groups. Preferably, a largest distance from the common optical axis of symmetry of any ray of a beam incident upon the objective is not more than 370 mm.

The first mirror of the first optical group is preferably concave, and the first optical group also preferably further includes at least one, and more preferably at least two, concave lens(es) before the first concave mirror.

The second optical group may include several lenses wherein each is a positive lens. A diameter of the beam incident upon each of these multiple lenses is preferably at least half of a diameter of each respective lens.

The third mirror of the mirrors of the first optical group is preferably a substantially spherical mirror. This substantially spherical third mirror is preferably concave. The fourth mirror of the first optical group is preferably convex.

A projection exposure apparatus is also provided including an excimer or EUV light source, an illumination system, a reticle handling, positioning and scanning system, a projection objective according to the above and a wafer handling, positioning and scanning system.

DETAILED DESCRIPTION OF THE PREFERRED EMBODIMENTS

In order to meet the above object of the invention, and to solve problems discussed above with respect to the related art systems, several catadioptric projection systems are disclosed. Each system is comprised of two distinct imaging groups G1 and G2. Group G1 is a catadioptric group that provides a conjugate stop position to correction chromatic aberration, if desired, and works to balance the aberrations of the aft group. This aft group, Group G2, is dioptric and enables the system to achieve numerical apertures up to and in excess of 0.75. This catadioptric system achieves high numerical aperture preferably using no beamsplitters or fold mirrors, making use of the rotational symmetry associated with an off-axis ring field.

Figure 1:
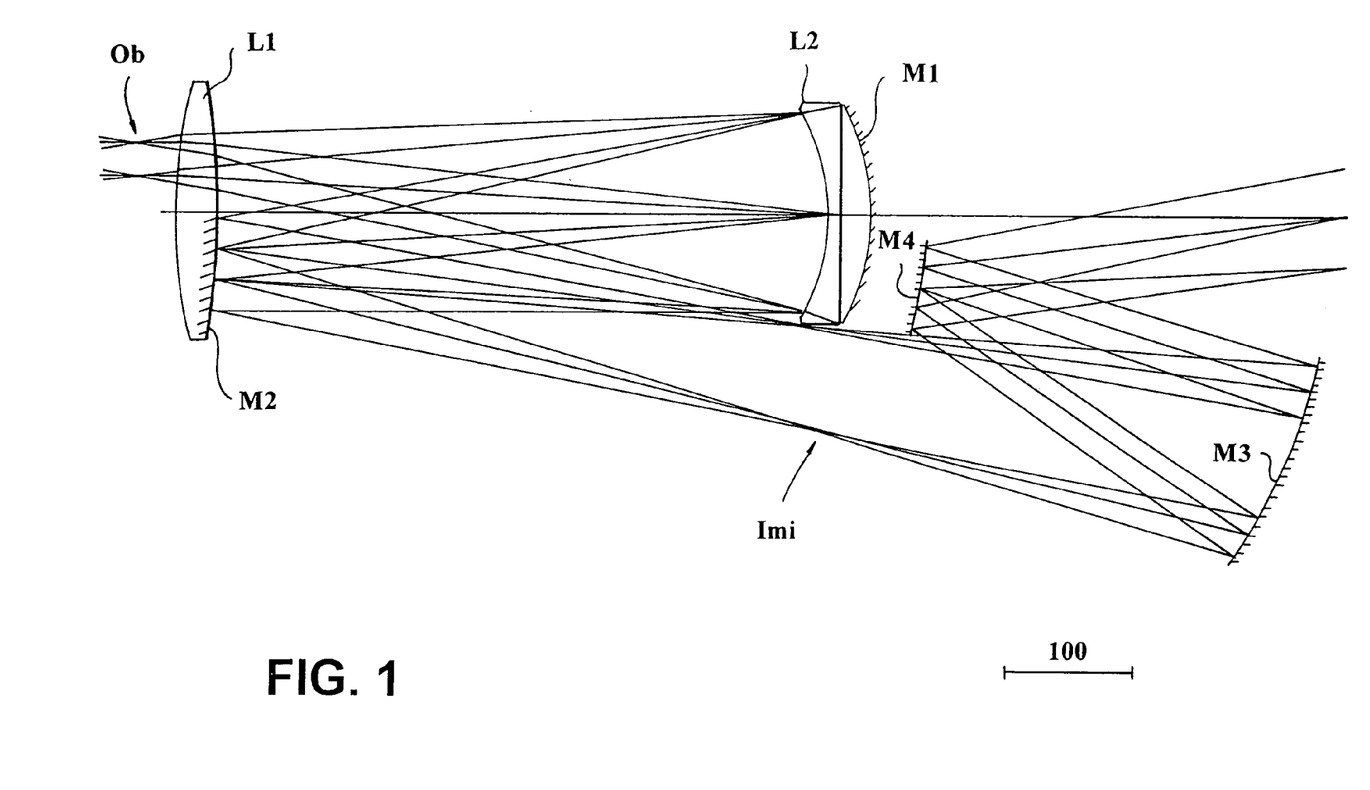
FIG. 1 schematically shows a front end of a microlithographic projection reduction objective according to a preferred embodiment.

FIG. 1 schematically shows a front end of a microlithographic projection reduction objective according to a preferred embodiment. The front end shown in FIG. 1 includes in optical sequence, from an object side to an image side, a field lens L1 which provides object side telecentricity, a second lens L2 which is concave and disposed just before a first mirror M1, a second mirror M2 preferably located on a portion of the first lens L1, a third mirror M3 which is shown as a cut off section of a spherical mirror located on a same axis as the other elements which may also be similarly cut off portions, i.e., L1, L2, M1, M2, and a convex fourth mirror M4.

The front end shown in FIG. 1 is preferably a part of a 0.25 reduction, 0.75 image side numerical aperture (NA) system having an image field size preferably between 5 mm×20 mm and 8 mm×30 mm, and more specifically 7 mm×26 mm. The front end shown in FIG. 1 is preferably particularly designed to be part of an overall objective having each of its components aligned along a common optical axis, or having their axes of symmetry located on this common axis. The front end shown in FIG. 1 is a catadioptric partial system providing a virtual image Imi between the second mirror M2 and the third mirror M3. The front end of FIG. 1 has enough axial chromatic aberration to compensate for a focussing lens group which forms a preferably 0.65, 0.70 or more preferably at least a 0.75 NA image. A real pupil or aperture plane would be preferably formed on the right hand end of the system within the focussing lens group (not shown, but see below). The system shown preferably has enough Petzval sum so that the focusing lens group can be made up of mostly or even entirely positive power lenses.

Only a single field lens L1 is shown in FIG. 1, and is located near the object plane Ob end of the system. That location of the field lens is advantageous with respect to providing reduced lens heating. There are preferably no aspherics in this front end. The mirrors M1 to M4 are preferably all spherical and coaxial to a common optical axis. It is possible to make this front end system be corrected for spherical aberration of the pupil, and a somewhat larger concave mirror than what is shown here would be used to achieve this.

This spherical aberration can also be corrected in the focusing lens group, and thus with respect to the front end shown in FIG. 1, the size of the concave mirror M3 is smaller than that which would be used to perform the spherical aberration correction. The smaller size of mirror M3 simplifies the mechanical construction of the system. In the example of FIG. 1, the concave mirror M3 has an illuminated area that is about 165 mm wide in the plane of the drawing and about 500 mm in the orthogonal direction, for a 7 mm×26 mm image field size.

Advantageously, the greatest distance of any ray from the common optical axis is about 370 mm in the example shown in FIG. 1. This is advantageously less than is the case for many designs, such as that shown and described in the '788 application described above. In the case of the design of the '788 application, the concave mirror thickness and mount thickness are added to the sideways ray path distance after the fold mirror, from the axis to the concave mirror. Therefore, this advantageous of the design of FIG. 1 is clearly seen.

More axial chromatic aberration and Petzval curvature may be included over that of the front end of FIG. 1, by increasing the power of the negative lens L2 near the concave mirror M1. A strong lens L2, however, may tend to put in more overcorrected spherical aberration than is desired, making the intermediate image aberrations be larger than desired. In view of this, a preferred alternative to the design shown in FIG. 1 includes two concave lenses near the concave mirror rather than the single lens L2 shown.

The field lens L1 near the object plane Ob can also be split into two weaker lenses, in an alternative embodiment, to improve control of pupil aberration. The convex mirror M2 that is near the reticle (Ob) can also be split off from the field lens L1 surface and made to be a separate optical element This alternative embodiment yields a more complicated design, but may provide improved performance and/or an additional degree of freedom.

Figure 2:
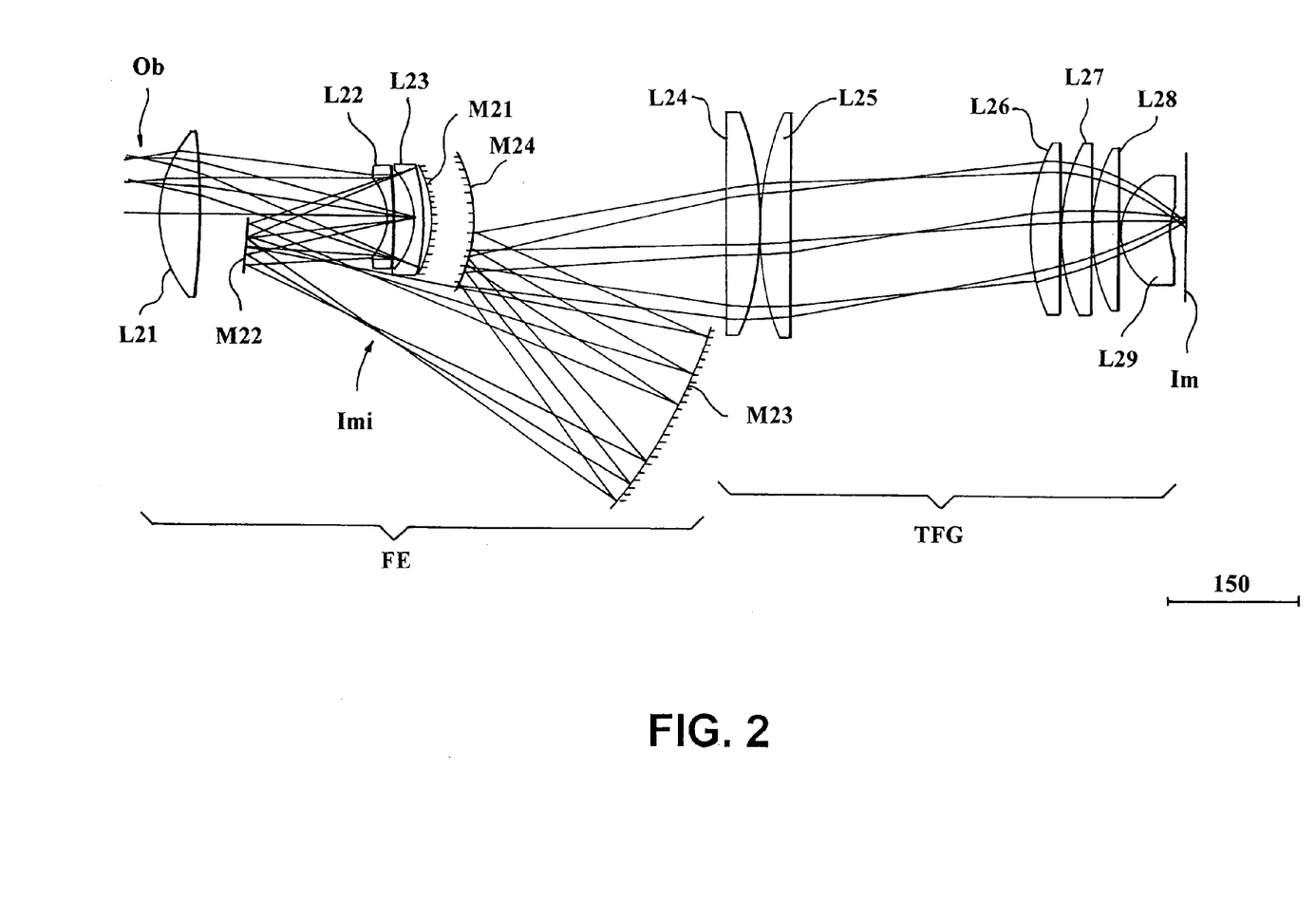
FIG. 2 schematically shows a microlithographic projection reduction objective according to a first preferred embodiment.

Also advantageously, it is possible to make this system meet high specifications, as well as to have correction for Petzval curvature, and axial and lateral color correction, with just positive lenses in the telecentric focusing group TFG. An example of such a focussing group is shown in FIG. 2. FIG. 2 shows a first embodiment of an objective having similar front end components, in general, to that described with respect to FIG. 1, except the concave lens L2 of FIG. 1 is split into two lenses L2 and Le. Otherwise, the front end elements L21, M21, M22, M232, and M24 of FIG. 2 correspond to elements L1, M1, M2, M3 and M4 of FIG. 1, and as such, the discussion above is incorporated here and not repeated.

The focussing group (TFG) of FIG. 2 includes six lenses L24 through L29. Lenses L24 and L25 are disposed in a first sub group of the focussing group and receive the beam as it diverges from mirror M24 of the front end (FE), or the virtual image formed behind mirror M24. Lenses L26, L27, L28 and L29 form a second sub group of the focussing lens group of the objective shown in FIG. 2. A real image Im of 4× reduction is formed after the lens L29.

The focussing group of FIG. 2 may be designed without any other kind of aberration correction, due to the aberration correction performed by the front end group. Lens heating in the objective of FIG. 2 is advantageously uniform, as the beam diameter is large on all the lenses L21 to L29. Preferably the beam diameter is at least 50% of the diameter of each respective lens of the focussing group upon which the beam is incident.

Figure 3:
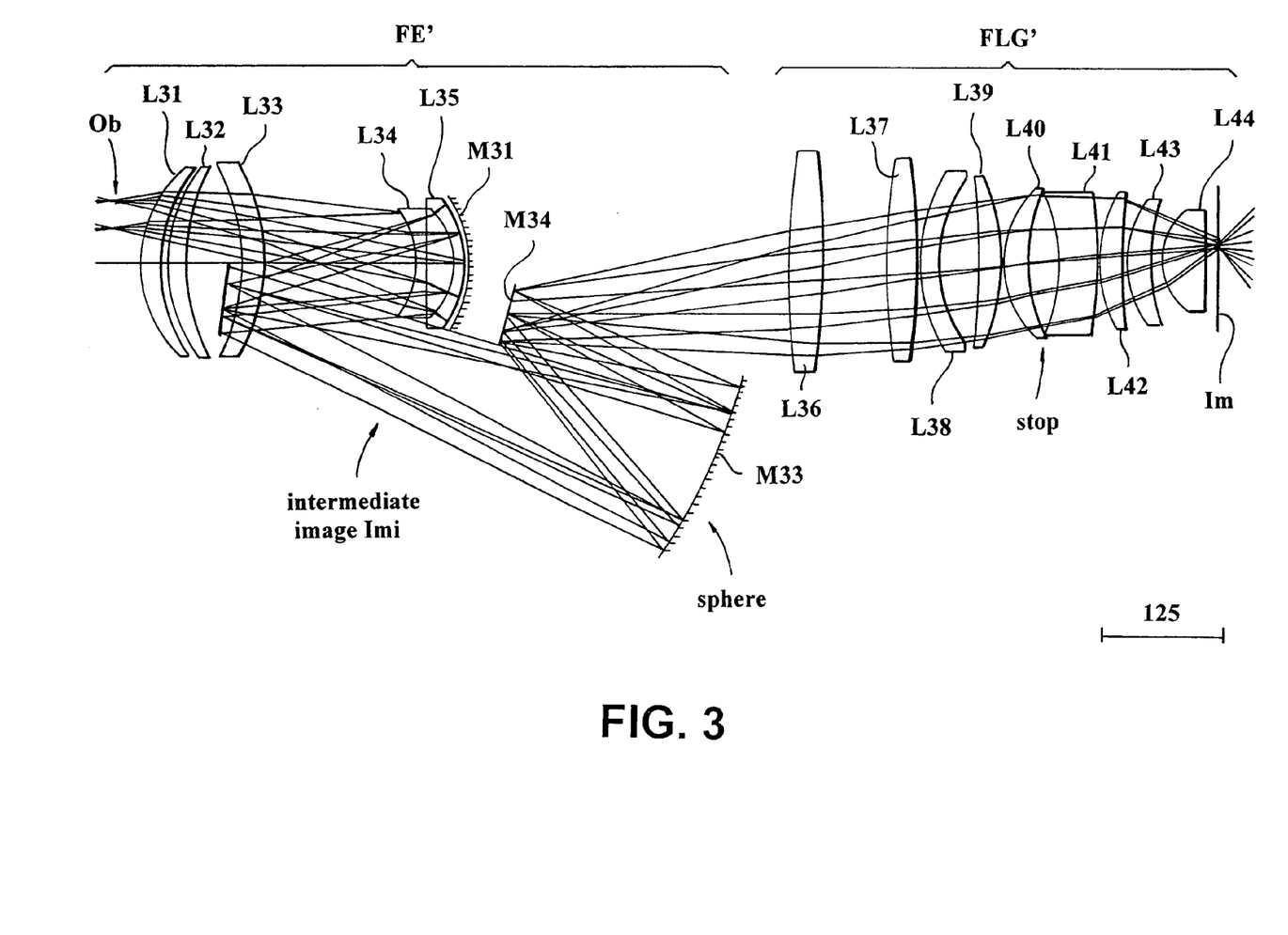
FIG. 3 schematically shows a microlithographic projection reduction objective according to a second preferred embodiment.

FIG. 3 shows an objective according to a second preferred embodiment. The details of the embodiment of FIG. 3 are set forth at Table 1, below. The front end FE' of the objective of FIG. 3 features a field lens group split into 3 lenses L31 to L33. These lenses L31 to L33 provide advantageous telecentricity at the object end of the objective. The front end FE' is otherwise similar to that shown at FIG. 2 and its elements are otherwise described above and not repeated here.

The focussing lens group FLG' of the objective of FIG. 3 has eight lenses L36 to L44 instead of the six lenses L24 to L29 of the objective of FIG. 2. This focussing lens group FLG' preferably has some aspherics, and aspherics may be included in the catadioptric front end FE' of the objective of FIG. 3 which simplify correction. The provision of these aspherics is not necessary, however, to meet the above object of the invention. The large mirror M33 is still preferably made to be a sphere, and this advantageously simplifies production.

Preferred locations of the aspheric surfaces, are near an aperture or pupil plane, namely on mirror M31 or on lenses L34, L35, where the marginal ray height preferably exceeds 80% of the height of the neighboring aperture, and alternatively on some distant locations with marginal ray heights less than 80% of the height of the next aperture. Examples of the latter ate surfaces of the field lens group or of the last two lenses next to the image plane 1m.

The polychromatic r.m.s. wavefront error value in this design now varies from 0.05 to 0.13 waves over a 26×7 mm field at 0.75 NA in a 4× design. The catadioptric front end FE' of the objective of FIG. 3 is more complicated than those shown in FIGS. 1 and 2. The design is doubly telecentric, i.e., exhibits telecentricity on both the object side and the image side, and is corrected for pupil aberration and distortion. The working distance is 34 mm on the reticle end (0b) and 12 mm on the wafer end (Im). The system length is about 1200 mm.

The focusing lens group FLG' is preferably all positive lenses except lens L41, with no particularly strong curvatures. A very large amount of aberration at the intermediate image may be included whereby the two concave lenses L31, L35 next to the concave mirror M31 do not have optimum bending in this embodiment.

Mechanical construction of the focussing lens groups FLG, FLG', or lens barrel, is advantageous when compared with catadioptric systems having a folding mirror for folding the optical axis as with the design of the '788 application. Folding mirrors are generally not desirable, as folding mirrors cause intensity losses and quality degradation of the light beam, production costs and adjustment work without improving image quality.

In the embodiments of FIGS. 2 and 3, preferably only the mirrors M32 and M33 are not provided as full disks. Even mirror M33, however, may be extended to a full annular body which can be mounted in a rotationally symmetric structure. The lens barrel is cut between the lenses L33 and L36 at a lower side of the drawing of FIG. 3 to provide passage to the light beam, and may be generally cylindrical. Only mirror M33 is positioned outside this cylindrical barrel, and even that is a moderate distance. Mirror M33 may be provided as an annular blank. Mirror M33 may be mounted as this annular part in a cylindrical barrel which is extended in diameter in this area.

Concave spherical mirror M33 is the preferably the only mirror reaching outside of a cylindrical envelope defined by the focusing lens group diameters, or scribed around all the lenses which has the radius of the lens of the greatest radius. The preferred objective, as exemplified above at FIGS. 2–3, thus has the advantage that it may be mounted in a compact cylindrical barrel of high intrinsic rigidity.

The preferred lens material is calcium fluoride, fluorspar, particularly for 157 nm applications. Other materials, standing alone or in combinations, may be used, namely at other wavelengths of excimer lasers or at EUV wavelengths. Quartz glass, eventually suitably doped, and fluoride crystals are such suitable materials.

A complete optical prescription is found in Table 1, describing the optical surfaces in Code V format.

TABLE 1

CODE V > lis
Shafer-design .75NA.4x.75 mm Obj.-hight

| | RDY | THI | RHD | GLA | CCY | THC | GLC |
|---|---|---|---|---|---|---|---|
| > OBJ: | INFINITY | 34.000000 | | | 100 | 100 | |
| 1: | 147.23281 | 21.000000 | | 'CAF-UV' | 100 | 100 | |
| 2: | 236.79522 | 1.000000 | | | 100 | 100 | |
| ASP: | | | | | | | |
| K: 0.000000 | | KC: 100 | | | | | |
| IC: YES | | CUF: 0.000000 | | CCF: 100 | | | |
| A: 0.273300E−07 | | B: 0.201130E−11 | | C: −.871260E−16 | | D: 0.118100E−19 | |
| AC: 100 | | BC: 100 | | CC: 100 | | DC: 100 | |
| 3: | 145.44401 | 27.000000 | | 'CAF-UV' | 100 | 100 | |
| 4: | 224.64885 | 51.185724 | | | 100 | 100 | |
| 5: | −223.00016 | 25.004072 | | 'CAF-UV' | 100 | 100 | |
| 6: | −184.59445 | 162.666291 | | | 100 | 100 | |
| 7: | −97.23630 | 12.000000 | | 'CAF-UV' | 100 | 100 | |
| 8: | −928.69926 | 24.980383 | | | 100 | 100 | |
| 9: | −75.28503 | 15.000000 | | 'CAF-UV' | 100 | 100 | |
| 10: | −116.14787 | 3.000000 | | | 100 | 100 | |
| 11: | −134.28262 | −3.000000 | REFL | | 100 | 100 | |
| ASP: | | | | | | | |
| K: 0.000000 | | KC: 100 | | | | | |
| IC: YES | | CUF: 0.000000 | | CCF: 100 | | | |
| A: 0.474810E−08 | | B: 0.506570E−12 | | C: −.284590E−17 | | D: 0.934830E−21 | |
| AC: 100 | | BC: 100 | | CC: 100 | | DC: 100 | |
| 12: | −116.14787 | −15.000000 | | 'CAF-UV' | 100 | 100 | |
| 13: | −75.28503 | −24.980383 | | | 100 | 100 | |
| 14: | −928.69926 | −12.000000 | | 'CAF-UV' | 100 | 100 | |
| 15: | −97.23630 | −162.666291 | | | 100 | 100 | |
| 16: | −184.59445 | −25.004072 | | 'CAF-UV' | 100 | 100 | |
| 17: | −223.00016 | −11.195502 | | | 100 | 100 | |
| 18: | −363.91714 | 11.195502 | REFL | | 100 | 100 | |
| ASP: | | | | | | | |
| K: 0.000000 | | KC: 100 | | | | | |
| IC: YES | | CUF: 0.000000 | | CCF: 100 | | | |
| A: −.107960E−07 | | B: 0.170830E−13 | | C: −.328180E−16 | | D: 0.143630E−20 | |
| AC: 100 | | BC: 100 | | CC: 100 | | DC: 100 | |
| 19: | −223.00016 | 25.004072 | | 'CAF-UV' | 100 | 100 | |
| 20: | −184.59445 | 162.666291 | | | 100 | 100 | |
| 21: | −96.00000 | 15.000000 | | | 100 | 100 | |
| ASP: | | | | | | | |
| K: −1.000000 | | KC: 100 | | | | | |
| IC: YES | | CUF: 0.000000 | | CCF: 100 | | | |
| A: 0.000000E+00 | | B: 0.000000E+00 | | C: 0.000000E+00 | | D: 0.000000E+00 | |
| AC: 100 | | BC: 100 | | CC: 100 | | DC: 100 | |
| 22: | INFINITY | 24.980383 | | | 100 | 100 | |
| 23: | −247.00000 | 67.808099 | | | 100 | 100 | |
| ASP: | | | | | | | |
| K: −1.000000 | | KC: 100 | | | | | |
| IC: YES | | CUF: 0.000000 | | CCF: 100 | | | |
| A: 0.000000E+00 | | B: 0.000000E+00 | | C: 0.000000E+00 | | D: 0.000000E+00 | |
| AC: 100 | | BC: 100 | | CC: 100 | | DC: 100 | |

TABLE 1-continued

CODE V > lis
Shafer-design .75NA.4x.75 mm Obj.-hight

| | RDY | THI | RHD | GLA | CCY | THC | GLC |
|---|---|---|---|---|---|---|---|
| 24: | −237.00000 | 266.861281 | | | 100 | 100 | |
| ASP: | | | | | | | |
| K: −1.000000 | | KC: 100 | | | | | |
| IC: YES | | CUF: 0.000000 | | CCF: 100 | | | |
| A: 0.000000E+00 | | B: 0.000000E+00 | | C: 0.000000E+00 | | D: 0.000000E+00 | |
| AC: 100 | | BC: 100 | | CC: 100 | | DC: 100 | |
| 25: | −470.62323 | −266.861281 | REFL | | 100 | 100 | |
| 26: | −210.84570 | 266.861281 | REFL | | 100 | 100 | |
| ASP: | | | | | | | |
| K: 0.000000 | | KC: 100 | | | | | |
| IC: YES | | CUF: 0.000000 | | CCF: 100 | | | |
| A: −.419940E−08 | | B: −.904030E−13 | | C: −.297400E−17 | | D: −.106340E−21 | |
| AC: 100 | | BC: 100 | | CC: 100 | | DC: 100 | |
| 27: | INFINITY | 35.031723 | | | 100 | 100 | |
| 28: | 1621.80000 | 33.000000 | | 'CAF-UV' | 100 | 100 | |
| ASP: | | | | | | | |
| K: 0.000000 | | KC: 100 | | | | | |
| IC: YES | | CUF: 0.000000 | | CCF: 100 | | | |
| A: 0.155580E−07 | | B: −.854090E−12 | | C: 0.123240E−16 | | D: −.559700E−21 | |
| AC: 100 | | BC: 100 | | CC: 100 | | DC: 100 | |
| 29: | −747.60113 | 67.859320 | | | 100 | 100 | |
| 30: | 827.21786 | 27.000000 | | 'CAF-UV' | 100 | 100 | |
| 31: | −1939.50000 | 20.227637 | | | 100 | 100 | |
| 32: | 197.25357 | 14.999969 | | 'CAF-UV' | 100 | 100 | |
| 33: | 128.31113 | 39.542169 | | | 100 | 100 | |
| 34: | −1370.10000 | 24.000000 | | 'CAF-UV' | 100 | 100 | |
| ASP: | | | | | | | |
| K: 0.000000 | | KC: 100 | | | | | |
| IC: YES | | CUF: 0.000000 | | CCF: 100 | | | |
| A: −.164770E−07 | | B: 0.155510E−11 | | C: −.542070E−16 | | D: 0.556740E−20 | |
| AC: 100 | | BC: 100 | | CC: 100 | | DC: 100 | |
| 35: | −253.41246 | 18.476467 | | | 100 | 100 | |
| 36: | 109.90063 | 30.001392 | | 'CAF-UV' | 100 | 100 | |
| STO: | 242.23740 | 22.529315 | | | 100 | 100 | |
| 38: | −264.99438 | 46.219742 | | 'CAF-UV' | 100 | 100 | |
| 39: | −372.29467 | 0.998929 | | | 100 | 100 | |
| 40: | 173.30822 | 24.000000 | | 'CAF-UV' | 100 | 100 | |
| ASP: | | | | | | | |
| K: 0.000000 | | KC: 100 | | | | | |
| IC: YES | | CUF: 0.000000 | | CCF: 100 | | | |
| A: 0.628520E−07 | | B: −.915530E−11 | | C: −.628040E−15 | | D: −.946620E−19 | |
| AC: 100 | | BC: 100 | | CC: 100 | | DC: 100 | |
| 41: | 1411.60000 | 4.845900 | | | 100 | 100 | |
| 42: | 110.28842 | 22.740804 | | 'CAF-UV' | 100 | 100 | |
| 43: | 160.79657 | 13.371732 | | | 100 | 100 | |
| 44: | 69.10873 | 45.185600 | | 'CAF-UV' | 100 | 100 | |
| 45: | −895.78799 | 11.999039 | | | 100 | 100 | |
| ASP: | | | | | | | |
| K: 0.000000 | | KC: 100 | | | | | |
| IC: YES | | CUF: 0.000000 | | CCF: 100 | | | |
| A: −.113590E−06 | | B: 0.281520E−09 | | C: −.171880E−12 | | D: 0.507740E−16 | |
| AC: 100 | | BC: 100 | | CC: 100 | | DC: 100 | |
| IMG: | INFINITY | 0.000000 | | | 100 | 100 | |

SPECIFICATION DATA

| NAO | −0.18750 | | | | |
|---|---|---|---|---|---|
| TEL | | | | | |
| DIH | HH | | | | |
| WL | 157.63 | 157.63 | 157.63 | | |
| REF | 2 | | | | |
| WTW | 1 | 1 | 1 | | |
| XOB | 0.00000 | 0.00000 | 0.00000 | 0.00000 | 0.00000 |
| | 0.00000 | 0.00000 | | | |
| YOB | 0.00000 | 26.51700 | 40.00000 | 53.03300 | 64.95100 |
| | 70.15600 | 75.00000 | | | |
| WTF | 0.00000 | 0.00000 | 1.00000 | 1.00000 | 1.00000 |
| | 1.00000 | 1.00000 | | | |
| VUX | 0.00000 | −0.00138 | −0.00308 | −0.00534 | −0.00803 |
| | −0.00941 | −0.01082 | | | |
| VLX | 0.00000 | −0.00138 | −0.00308 | −0.00534 | −0.00803 |
| | −0.00941 | −0.01082 | | | |
| VUY | 0.00000 | −0.00065 | −0.00224 | −0.00398 | −0.00520 |
| | −0.00531 | −0.00535 | | | |

TABLE 1-continued

CODE V > lis
Shafer-design .75NA.4x.75 mm Obj.-hight

|  | RDY | THI | RHD | GLA | CCY | THC | GLC |
|---|---|---|---|---|---|---|---|
| VLY | 0.00000 | −0.00370 | −0.00706 | −0.01156 | −0.01709 | | |
|  | −0.01985 | −0.02220 | | | | | |

APERTURE DATA/EDGE DEFINITIONS

CA
APERTURE data not specified for surface Obj thru 45

PRIVATE CATALOG

| PWL | 157.63 | 157.63 | 157.63 |
|---|---|---|---|
| 'CAF-UV' | 1.558411 | 1.558410 | 1.558489 |

REFRACTIVE INDICES

| GLASS CODE | | 157.63 | 157.63 | 157.63 |
|---|---|---|---|---|
| 'CAF-UV' | | 1.558409 | 1.558410 | 1.558411 |

No solves defined in system
No pickups defined in system

INFINITE CONJUGATES

| EFL | −66053.1391 |
|---|---|
| BFL | −16500.9052 |
| FFL | 0.2642E+06 |
| FNO | 0.0000 |

AT USED CONJUGATES

| RED | −0.2500 |
|---|---|
| FNO | −0.6667 |
| OBJ DIS | 34.0000 |
| TT | 1198.5356 |
| ING DIS | 11.9990 |
| DAL | 1152.5365 |

PARAXIAL IMAGE

| HT | 18.7496 |
|---|---|
| THI | 12.0008 |
| ANG | 0.0000 |

ENTRANCE PUPIL

| DIA | 0.3818E+10 |
|---|---|
| THI | 0.1000E+11 |

EXIT PUPIL

| DIA | 25217.8299 |
|---|---|
| THI | −16501.3415 |

CODE V > out t

In general, four, six and eight or more mirror objective designs understood to those skilled in the art of EUV lithography or DUV or VUV lithography may be consulted as providing alternatives to the preferred front end groups FLG, FLG', wherein these designs may be combined with a focussing lens group such as those set forth herein, except that the final mirror would be convex rather than concave, as is generally disclosed in these other designs. Such designs would also correspondingly deviate from their originally disclosed designs in that a virtual image instead of a real image is provided to the focussing lens group to reduce to a real image. For this purpose, and with respect to the third embodiment provided below, the following references are hereby incorporated by reference into the detailed description of the preferred embodiment, and also as disclosing alternative embodiments of elements or features of the preferred embodiment not otherwise set forth in detail above or below or in FIGS. 1–4. A single one or a combination of two or more of these references may be consulted to obtain a variation of the preferred embodiment described above. In this regard, luther patent, patent application and nonpatent references, and discussion thereof, cited in the background and/or elsewhere herein are also incorporated by reference into the detailed description of the preferred embodiment with the same effect as just described with respect to the following references:

U.S. Pat. Nos. 5,323,263, 5,515,207, 5,537,260, 4,685,777, 5,071,240, 5,815,310, 5,401,934, 4,595,295, 4,232,969, 5,742,436, 5,805,357, 5,835,275, 5,052,763, 4,171,871, 5,241,423, 5,089,913, 5,159,172, 5,608,526, 5,212,588, 5,686,728, 5,220,590, 5,153,898, 5,353,322, 5,315,629, 5,063,586, 5,410,434, 5,956,192, 5,071,240, 5,078,502, 6,014,252, 5,805,365, 6,033,079, 4,701,035 and 6,142,641;

European patent applications no. 0 816 892 A1 and 0 779 528 A; and

German patent no. DE 196 39 586 A.

Figure 4:
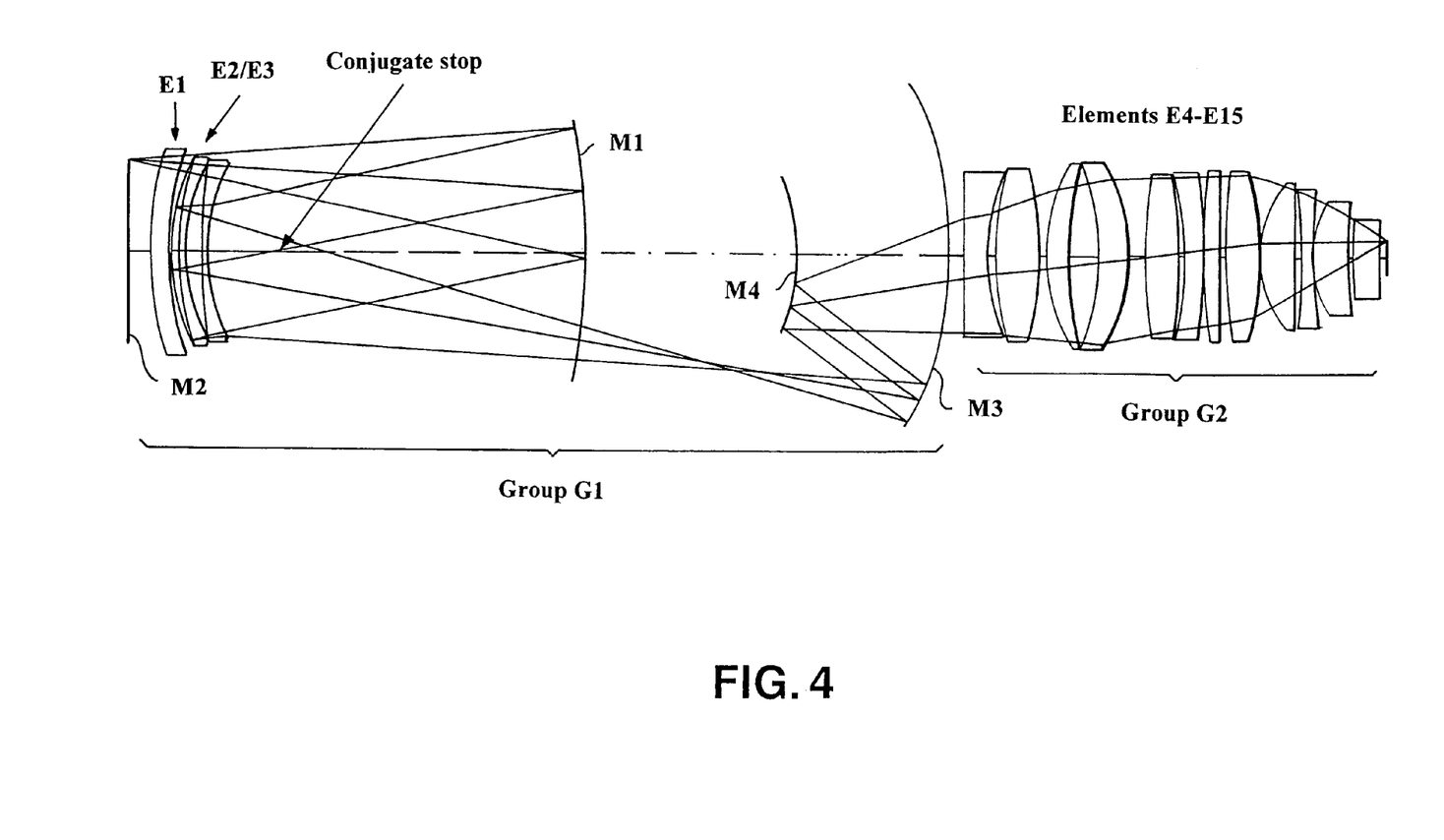
FIG. 4 schematically shows a microlithographic projection reduction objective according to a third embodiment.

An objective of a projection system according to a third embodiment is illustrated at FIG. 4. The system is separated into two groups: (1) Group G1 including 4-mirrors and 3 lens elements and (2) Group G2 including 12 individual lens elements. Referring to FIG. 4, group G1 includes lenses E1–E3 near the object plane and a conjugate stop between the first mirror M1 and second mirror. Unlike the above embodiments, there are no lens elements shown located near mirror M1, although one or more may be included. The group G1 then also includes concave mirror M3 and convex mirror M4. The group G2 includes lens elements E4 through E15, as shown, and as described in detail below with reference to Table 2.

The design of FIG. 4 is coaxial with a single common center axis, and no beamsplitters or fold mirrors are used. This preferred embodiment also utilizes an off-axis ring field to achieve ray clearance so that the mask and wafer planes are parallel. Group G1 forms a minified, virtual image located behind mirror M4 at a reduction of ~0.7×. Group G2 takes this virtual image and forms a usable real image at the image plane. Group G2 operates at a reduction of about 0.29×, allowing the system to achieve a reduction of 0.20×. A complete optical prescription is found in Table 3, describing the optical surfaces in Code V format.

To correct chromatic aberration, the aperture stop that lies in Group G2 has a conjugate position in G1 between mirror M1 and M2. This allows a negative chief ray height at elements E2 and E3 (for a positive field height at the reticle). This chief ray height, when combined with the sign of the marginal ray and the negative power of the E2/E3 pair, advantageously provides for a lateral chromatic aberration contribution that substantially cancels the lateral color contribution from Group G2. Assuming a spectral bandwidth of 0.5 pm, this specific embodiment has a paraxial lateral color contribution from E2/E3 of ~18 nm, whereas the paraxial lateral color contribution from Group G2 is ~−18 nm, making the sum total approximately 0 nm. The principle result is that the power distribution and shapes of the lenses in Group G2 take on a very advantageous form.

At mirror M2, negative lenses E2/E3 are used in a double-pass configuration to induce overcorrected (positive) axial chromatic aberration used to correct the undercorrected (negative) axial chromatic aberration created by the strong positive optical power of group G2. The monochromatic aberrations are corrected via a balance between groups G1 and G2. This is done in such a manner as to leave the lens elements in group G2 "unstressed." The term "unstressed" is used to signify the fact that steep ray bendings are used sparingly within G2 to promote high-order aberration correction. Both the chief and marginal rays exhibit this behavior. The fact that this group is "unstressed" will be advantageous when manufacturing and assembly tolerances are considered in detail. Table 2 provides a performance summary of the advantageous third embodiment of FIG. 4.

TABLE 2

Performance Summary Third Preferred Embodiment

| Parameter | Performance |
|---|---|
| Wavelength (nm) | 157 |
| Bandwidth (pm) | 0.5 |
| Reduction ratio (R) | 0.20 |
| Field size (mm) | 26 × 7 |
| Numerical aperture (NA) | 0.75 |
| RMS wavefront error (waves) | 0.0057 |
| Distortion (nm) | <0.5 nm |
| Paraxial Axial Color | 25.0 |
| Paraxial Lateral Color | 0.0 |
| Total track (mm) | 1172.2 |
| Front working distance (mm) | 25.2 |
| Back working distance (mm) | 6.30 |

Lens element E1 provides for the telecentric condition at the plane of the mask. It is advantageous to have positive optical power near the mask to reduce the chief ray height on mirror M1. Lens element E1 appears to lie in conflict with the substrate of mirror M2. To achieve this concept in practice, only a small off-axis section of E1 would be used. This means that pieces of a complete E1 could be sectioned to yield pieces for multiple projection systems, further reducing the required blank mass of a single system. Another option to resolve the apparent conflict between E1 and the substrate of M2 is to place E1 between M1 and M2, somewhere close to element Group E2/E3. In this manner, the complete E1 would be used.

Table 2 summarizes design performance of the system, as mentioned. The system has a composite RMS wavefront error of 0.006λ evaluated monochromatically over the field. The distortion is less than 0.5 nm at all field points, and the lateral color is corrected to better than 1 mn and around substantially 0 nm. The axial color is also small and could be reduced further with some additional detailed design effort. This design approaches the "zero aberration" condition required by state of the art DUV lithographic printing systems at the design level.

TABLE 3

Optical design prescription second preferred embodiment

| | RDY | THI | RMD | GLA |
|---|---|---|---|---|
| OBJ: | INFINITY | 25.200000 | | |
| 1: | 272.04659 | 17.967063 | | 'cafl_vuv' |
| 2: | 430.38693 | 376.060423 | | |
| 3: | −910.28297 | −343.728468 | REFL | |

ASP:
K: −2.656682
A: −.326647E−08   B: 0.331705E−14   C: 0.110206E−18   D: 0.129992E−23
E: −.253028E−27   F: 0.935671E−32   G: 0.000000E+00   H: 0.000000E+00

| 4: | 204.19199 | −5.250000 | | 'cafl_vuv' |
|---|---|---|---|---|
| 5: | 626.80115 | −14.709764 | | |
| 6: | 180.80110 | −5.250000 | | 'cafl_vuv' |
| 7: | 409.96989 | −7.122191 | | |
| 8: | 237.40886 | 7.122191 | REFL | |

ASP:
K: −0.078203
A: 0.635412E−09   B: 0.800651E−14   C: −.144355E−21   D: 0.171060E−21
E: −.150405E−25   F: 0.114525E−29   G: 0.000000E+00   H: 0.000000E+00

| 9: | 409.96989 | 5.250000 | | 'cafl_vuv' |
|---|---|---|---|---|
| 10: | 180.80110 | 14.709764 | | |
| 11: | 626.80115 | 5.250000 | | 'cafl_vuv' |

TABLE 3-continued

Optical design prescription second preferred embodiment

| | RDY | THI | RMD | GLA |
|---|---|---|---|---|
| 12: | 204.19199 | 524.917809 | | |
| 13: | INFINITY | 168.980933 | | |

SLB: "Intermediate image"

| | RDY | THI | RMD | GLA |
|---|---|---|---|---|
| 14: | −356.49533 | −146.457429 | REFL | |

ASP:
K: 0.352560
A: 0.135966E−08    B: 0.105253E−13   C: 0.192267E−18   D: −.206356E−23
E: 0.492049E−28    F: −.157593E−33   G: 0.000000E+00   H: 0.000000E+00

| | RDY | THI | RMD | GLA |
|---|---|---|---|---|
| 15: | −228.54533 | 146.457429 | REFL | |

ASP:
K: 2.664030
A: 0.215234E−07    B: 0.106546E−11   C: 0.492342E−16   D: 0.468147E−20
E: −.257647E−24    F: 0.414796E−28   G: 0.000000E+00   H: 0.000000E+00

| | RDY | THI | RMD | GLA |
|---|---|---|---|---|
| 16: | INFINITY | 16.484112 | | |
| 17: | 875.73752 | 21.000000 | | 'cafl_vuv' |

ASP:
K: 0.000000
A: −.553325E−07    B: −.937309E−12   C: −.476822E−16   D: 0.173905E−20
E: −.833857E−24    F: 0.619058E−28   G: 0.000000E+00   H: 0.000000E+00

| | RDY | THI | RMD | GLA |
|---|---|---|---|---|
| 18: | 156.88423 | 13.188039 | | |
| 19: | 389.92251 | 36.400000 | | 'cafl_vuv' |
| 20: | −337.07442 | 11.141472 | | |
| 21: | 185.85909 | 23.538146 | | 'cafl_vuv' |
| 22: | 753.09936 | 18.669637 | | |
| 23: | −265.83545 | 27.849147 | | 'cafl_vuv' |
| 24: | −173.60000 | 17.747312 | | |
| STO: | INFINITY | 0.700000 | | |

SLB: "stop"

| | RDY | THI | RMD | GLA |
|---|---|---|---|---|
| 26: | 391.12722 | 28.000000 | | 'cafl_vuv' |

ASP:
K: −18.719562
A: −.283210E−07    B: −.433536E−11   C: 0.727966E−16   D: −.200778E−19
E: 0.132891E−23    F: −.118097E−27   G: 0.000000E+00   H: 0.000000E+00

| | RDY | THI | RMD | GLA |
|---|---|---|---|---|
| 27: | −638.43054 | 7.256264 | | |
| 28: | −253.22318 | 14.000000 | | 'cafl_vuv' |
| 29: | −1245.09480 | 0.700000 | | |
| 30: | 388.41418 | 16.065985 | | 'cafl_vuv' |
| 31: | −8146.73218 | 5.791929 | | |
| 32: | 555.01025 | 32.405007 | | 'cafl_vuv' |
| 33: | −244.52990 | 0.700000 | | |
| 34: | 114.78165 | 31.203164 | | 'cafl_vuv' |
| 35: | −1868.59832 | 4.112970 | | |
| 36: | −453.05751 | 11.200000 | | 'cafl_vuv' |
| 37: | 448.89716 | 1.095042 | | |
| 38: | 134.42314 | 30.266428 | | 'cafl_vuv' |
| 39: | 523.87075 | 3.406381 | | |

ASP:
K: −82.756787
A: 0.675698E−07    B: −.184335E−11   C: −.661293E−15   D: 0.523702E−18
E: −.169683E−21    F: 0.230534E−25   G: 0.000000E+00   H: 0.000000E+00

| | RDY | THI | RMD | GLA |
|---|---|---|---|---|
| 40: | 167.86417 | 23.561170 | | 'cafl_vuv' |
| 41: | INFINITY | 6.300000 | | |
| IMG: | INFINITY | 0.000000 | | |

SPECIFICATION DATA

| | | | | | |
|---|---|---|---|---|---|
| NAO | 0.15000 | | | | |
| TEL | | | | | |
| DIM | MM | | | | |
| WL | 157.63 | 157.63 | 157.63 | | |
| REF | 2 | | | | |
| WTW | 0 | 1 | 0 | | |
| XOB | 0.00000 | 0.00000 | 0.00000 | 0.00000 | 0.00000 |
| YOB | 66.50000 | 75.25000 | 84.00000 | 92.75000 | 101.50000 |

AT USED CONJUGATES

| | |
|---|---|
| RED | −0.2001 |
| FNO | −0.6668 |
| OBJ DIS | 25.2881 |
| TT | 1141.0138 |
| IMG DIS | 6.3000 |
| OAL | 1109.4257 |

TABLE 3-continued

Optical design prescription second preferred embodiment

| | RDY | THI | RMD | GLA |
|---|---|---|---|---|
| | PARAXIAL IMAGE | | | |
| HT | | 20.3055 | | |
| THI | | 6.2972 | | |
| ANG | | 0.0000 | | |
| | ENTRANCE PUPIL | | | |
| DIA | | 0.3034E+10 | | |
| THI | | 0.1000E+11 | | |
| | EXIT PUPIL | | | |
| DIA | | 3371.6319 | | |
| THI | | −2216.6260 | | |

The optical design description provided herein demonstrates an advantageous catadioptric projection system for DUV or VUV lithography. While this embodiment has been designed for use in a 157 nm tool, the basic concept has no wavelength limitations, either shorter or longer, providing a suitable refractive material exists In summary with particular respect to the third embodiment, the optical system is catadioptric consisting of two groups, G1 and G2, constructed so that G1 presents a reduced, virtual image to G2. The function of G2 is to relay this virtual image to a real image located at the plane of the wafer. G1 is constructed of preferably 4 or 6 mirrors in combination with several lens elements which lens elements have a primary function to provide telecentricity at the mask and enable correction of axial chromatic aberration. In this embodiment, an image of the aperture stop is located between mirror M1 and M2.

Group G2 is preferably entirely dioptric providing most of the system reduction and a corresponding high numerical aperture (up to or in excess of 0.75) at the wafer. This group also makes the final image telecentric in wafer space. Group G1 functions to correct high-order field aberrations and the Petzval sum, allowing an advantageously substantial relaxation of the lens elements found in G2. Both G1 and G2 make use of aspheric surfaces as listed in Table 2.

The system is coaxial, wherein each of the optical elements is rotationally symmetric about a common centerline. This common centerline, often called the optical axis or opto-mechanical axis, also includes the mask and wafer. The system does not utilize fold mirrors, prisms, or beamsplitters to fold the optical axis in any way. This enables a compact configuration and eliminates bulk refractive material that may be difficult to procure in a timely manner.

The optical system achieves mask and wafer planes that are parallel to each other and perpendicular to the optical axis, enabling unlimited scanning in a step/scan lithographic configuration.

Correction of chromatic aberration is achieved using a single optical material in this catadioptric configuration The lateral chromatic aberration is substantially balanced between Group G1 and G2, using a favorable balance of optical power after the conjugate aperture stop located between mirror M1 and M2 . Correction of axial chromatic aberration is enabled using a negative lens group located at mirror M2 in G1, providing an axial chromatic aberration contribution that is nearly equal in magnitude and opposite in sign to the chromatic aberration generated by G2. This high level of axial chromatic aberration correction eliminates the need for a high spectral purity laser with linewidths on the order of 0.15 pm.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof. In addition, the features of different claims set forth below may be combined in various ways in further accordance with the present invention.

What is claimed is:

1. A photolithographic reduction projection catadioptric objective, comprising:
a first optical group including an even number of at least four mirrors; and
a second substantially refractive optical group more image forward than said first optical group including a number of lenses and having a magnifying power for providing image reduction,
wherein optical surfaces of each mirror of said objective are at least sections of revolution each having a common optical axis and a most imageward mirror comprises a convex mirror.

2. The objective of claim 1, wherein the objective has a positive overall reduction ratio.

3. A projection exposure apparatus, comprising:
a light source selected from the group consisting of a DUV and a VUV light source;
an illumination system;
a reticle handling, positioning and scanning system;
a projection objective according to claim 1; and a wafer handling, positioning and scanning system.

4. The objective of claim 1, wherein the objective comprises an unobscured system comprising a straight axis of symmetry of all curvatures of all optical elements, and includes more than two mirrors, and wherein one optical element is cut in a substantially non rotationally symmetric form.

5. A photolithographic reduction projection catadioptric objective, comprising:
a first optical group including an even number of at least four mirrors; and a second substantially refractive optical group more image forward than said first optical group including a number of lenses and having a magnifying power for providing image reduction, wherein optical surfaces of each mirror of said objective are at least sections of revolution each having a common optical axis, wherein said first optical group provides compensative aberrative correction for said second optical group which forms an image with a numerical aperture of at least substantially 0.65, and a most imageward mirror comprises a convex mirror.

6. The objective of claim 5, wherein said image is formed with a numerical aperture of at least substantially 0.70.

7. The objective of claim 5, wherein said image is formed with a numerical aperture of at least substantially 0.75.

8. The objective of claim 5, said first optical group for producing an intermediate virtual image for reduction by the second optical group which receives said virtual image.

9. The objective of claim 5, wherein said at least four mirrors of said first optical group includes a convex most image forward mirror, and wherein said second optical group receives a beam from said convex most image forward mirror.

* * * * *